United States Patent [19]

Okada et al.

[11] Patent Number: 4,654,690
[45] Date of Patent: Mar. 31, 1987

[54] CAPACITIVE ELEMENTS WITH REDUCED STRAY CAPACITANCE

[75] Inventors: Keisuke Okada; Masao Nakaya, both of Itami, Japan

[73] Assignee: Mitsubishi Denki Kabushiki Kaisha, Tokyo, Japan

[21] Appl. No.: 701,218

[22] Filed: Feb. 13, 1985

[30] Foreign Application Priority Data

Apr. 5, 1984 [JP] Japan ................................. 59-69423

[51] Int. Cl.$^4$ ...................... H01L 27/02; H01L 23/48
[52] U.S. Cl. ........................................ 357/51; 357/65; 357/68
[58] Field of Search ....................... 357/23.1, 23.6, 51, 357/65, 23.13, 59 R, 68

[56] References Cited

U.S. PATENT DOCUMENTS

| | | | |
|---|---|---|---|
| 4,366,455 | 12/1982 | Berger | 357/51 |
| 4,409,608 | 10/1983 | Yoder | 357/51 |
| 4,475,118 | 10/1984 | Klein et al. | 357/51 |
| 4,509,067 | 7/1985 | Minami et al. | 357/51 |
| 4,587,549 | 5/1986 | Ushiku | 357/68 |

FOREIGN PATENT DOCUMENTS 56-74954  6/1981  Japan ..................... 357/51
57-7970   1/1982  Japan ..................... 357/23.13

OTHER PUBLICATIONS

L. M. Arzubi et al, "Metal-Oxide Semiconductor Capacitor", *IBM Technical Disclosure Bulletin*, vol. 17 (1974), pp. 1569-1570.
P. Evrenidis et al, "Detecting Insulator Surface Charge", *IBM Technical Disclosure Bulletin*, vol. 13 (1971), p. 2797.
"Improvements in Monolithic Analogue to Digital Converter Design", *Electronic Engineering*, (Jun. 1980), pp. 90-91.

*Primary Examiner*—J. Carroll
*Attorney, Agent, or Firm*—Lowe Price LeBlanc Becker & Shur

[57] ABSTRACT

A capacitive element of a semiconductor integrated circuit comprising a first conductor provided in the input side and a second conductor provided in the output side further includes a third conductor to be connected with the first conductor. The front and back surfaces of the second conductor are entirely covered by the first and third conductors. Portions connecting the first and third conductors are arranged along the peripheral edge portions of the second conductor excepting a signal extracting portion.

2 Claims, 5 Drawing Figures

CAPACITIVE ELEMENTS WITH REDUCED STRAY CAPACITANCE

BACKGROUND OF THE INVENTION

1. Field of the Invention

The present invention relates to a semiconductor integrated circuit, and more particularly, to a semiconductor integrated circuit reducing the stray capacitance in the output side of a capacitive coupled circuit.

2. Description of the Prior Art

Description is now made of a conventional semiconductor integrated circuit for propagating signals through a capacitive element. FIG. 1 is an equivalent circuit diagram of such a conventional circuit and FIG. 2 is a layout diagram showing a typical example of the layout of such a circuit. In these drawings, a capacitive element 3 is formed by a first conductor 1 and a second conductor 2. The first conductor 1 is connected to an input terminal 5 and the second conductor 2 is connected to an output terminal 6, respectively. Numeral 4 indicates the stray capacitance generated in the second conductor 2.

Assuming that the input signal voltage applied to the input terminal 5 is represented by $V_1$ and the capacitance of the capacitive element 3 is represented by $C_C$ while the stray capacitance 4 is represented by $C_S$ and the output signal voltage propagated to the output terminal 6 is represented by $V_2$ in the above circuit, the relation between the input voltage $V_1$ and the output voltage $V_2$ is expressed as follows:

$$V_2 = \frac{V_1}{1 + \frac{C_S}{C_C}} \tag{a}$$

In the conventional circuit, the input voltage $V_1$ and the output voltage $V_2$ are in the relation as expressed by the above equation (a), and hence it is necessary to increase the capacitance $C_C$ or decrease the stray capacitance $C_S$ to extract a high output voltage. However, the area of the second conductor 2 must be enlarged for increasing the capacitance $C_C$ whereby the stray capacitance $C_S$ is inevitably increased, leading to contradiction in the above relation and difficulty in correct propagation of fine signals.

Improvements in capacities of capacitive elements are disclosed in *Electronic Engineer* June, 1980, pp. 91-92 and U.S. Pat. No. 4,075,509 issued on Feb. 21, 1978.

SUMMARY OF THE INVENTION

The present invention has been proposed to overcome the aforementioned disadvantage of the prior art. Accordingly, an object of the present invention is to provide a semiconductor integrated circuit which comprises a capacitive element capable of reducing the stray capacitance generated in a second conductor thereby to correctly propagate fine signals.

The semiconductor integrated circuit according to the present invention comprises a capacitive element having a first conductor provided in the input side and a second conductor provided in the output side, and the capacitive element further includes a third conductor which is connected to the first conductor. Thus, the front and back surfaces of the second conductor are entirely covered by the first and third conductors. Further, portions connecting the first and third conductors are arranged along the peripheral edge portions of the second conductor excepting a signal extracting portion. Consequently, the second conductor is enclosed by the first and third conductors and the portions connecting the same to be substantially completely shielded. Namely, the stray capacitance generated in the second conductor is reduced, whereby fine signals can be correctly propagated through the capacitive element.

The above and other objects, features, aspects and advantages of the present invention will become more apparent from the following detailed description of the present invention when taken in conjunction with the accompanying drawings.

DESCRIPTION OF THE PREFERRED EMBODIMENT

A preferred embodiment of the present invention is now described with reference to FIGS. 3 and 4.

Figure 1:
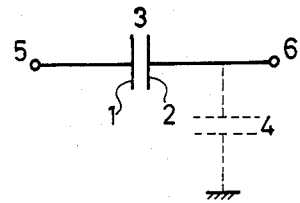
FIG. 1 is an equivalent circuit diagram showing a conventional semiconductor integrated circuit.
Figure 2:
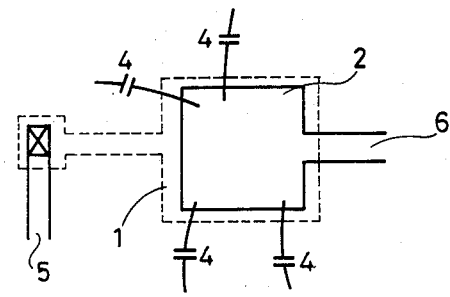
FIG. 2 is a layout diagram showing an example of layout of the circuit as shown in FIG. 1.
Figure 3:
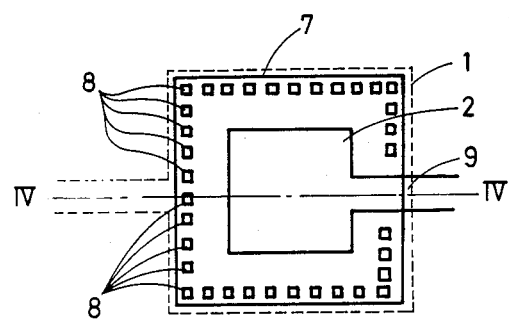
FIG. 3 is a layout diagram showing an embodiment of a semiconductor integrated circuit according to the present invention.
Figure 4:
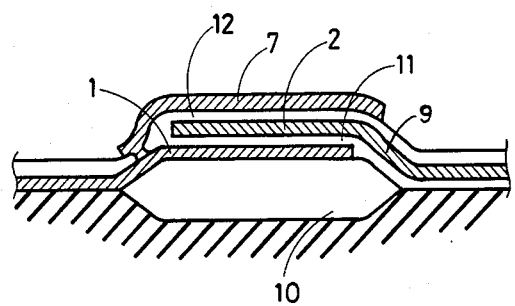
FIG. 4 is a cross-sectional view taken along the line IV—IV in FIG. 3.

FIG. 3 is a layout diagram showing an embodiment of a semiconductor integrated circuit according to the present invention, and FIG. 4 is a cross-sectional view taken along the line IV—IV in FIG. 3. Explanation is herein omitted with respect to components similar to those in FIG. 2 showing the conventional semiconductor integrated circuit, which are indicated by the same reference numerals.

As shown in FIGS. 3 and 4, a second conductor 2 is provided in a superposed manner on a first conductor 1 through an insulating film 11, while a third conductor 7 is superposed on the second conductor 2 through an insulating film 12 to cover the entire surface thereof. The insulating films 11 and 12 are made of insulating material such as silicon dioxide ($SiO_2$) or trisilicon tetranitride ($Si_3N_4$). The first and third conductors 1 and 7 are connected with each other through contact windows 8, which are arranged along the peripheral edge portions of the second conductor 2 excepting an output extracting portion 9 thereof. The first and third conductors 1 and 7 are connected with each other through contact holes defined in the contact windows 8.

The input and output voltages of the present embodiment are also in the relation as expressed by the above equation (a). However, the third conductor 7 is in contact with the first conductor 1 along the entire peripheral edge portions of the second conductor 2 except for the output extracting portion 9, and hence the capacitance $C_C$ is increased while the stray capacitance $C_S$ is extremely reduced. Thus, fine signals can be effectively propagated by the semiconductor integrated circuit according to the present invention with slight increase in the area of the second conductor 2.

It is to be noted that numeral 10 in FIG. 4 indicates an insulating film of silicon dioxide ($SiO_2$) or trisilicon tetranitride ($Si_3N_4$).

Figure 5:
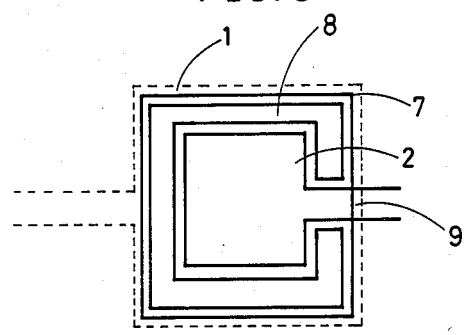
FIG. 5 is a layout diagram showing another embodiment of the present invention.

Although a plurality of small contact windows 8 are provided along the entire peripheral edge portions of the second conductor 2 except for the output extracting portion 9 in the present embodiment, they may be replaced by a contact window 8 as shown in FIG. 5 whose edges are substantially identical in length to the edges of a third conductor 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit for propagating signals through a capacitive element comprising a first conductor provided in the input side, a second conductor provided in the output side, and a signal output extracting portion connected to the second conductor, said capacitive element further including a third conductor connected to said first conductor with said second conductor being interposed between said third conductor and said first conductor together substantially entirely covering front and back surfaces of said second conductor, portions connecting said first and third conductors together, said connect-ing portions being arranged along substantially the entire peripheral edge portions of said second conductor excepting said signal extracting portion.

2. The circuit of claim 1, further including a plurality of contact windows provided along the entire peripheral portion of the second conductor except for said signal output extracting portion, said first and third conductors being connected to each other through said contact windows.

* * * * *